United States Patent [19]

Scifres et al.

[11] 4,280,107

[45] Jul. 21, 1981

[54] APERTURED AND UNAPERTURED REFLECTOR STRUCTURES FOR ELECTROLUMINESCENT DEVICES

[75] Inventors: Donald R. Scifres, Los Altos; Fernando A. Ponce, Stanford; G. A. Neville Connell, Cupertino; William Streifer, Palo Alto, all of Calif.

[73] Assignee: Xerox Corporation, Stamford, Conn.

[21] Appl. No.: 64,698

[22] Filed: Aug. 8, 1979

[51] Int. Cl.³ ............................................. H01S 3/19
[52] U.S. Cl. ......................... 331/94.5 H; 331/94.5 C; 350/164; 357/17
[58] Field of Search ............. 331/94.5 H, 94.5 C; 357/17, 18; 350/164, 166

[56] References Cited

U.S. PATENT DOCUMENTS

| | | | |
|---|---|---|---|
| 3,843,401 | 10/1974 | Carroll | 331/94.5 H X |
| 3,866,238 | 2/1975 | Monroe | 331/94.5 H X |
| 4,001,719 | 1/1977 | Krupka | 331/94.5 H |
| 4,092,659 | 5/1978 | Ettenberg | 331/94.5 H X |
| 4,100,508 | 7/1978 | Wittke | 331/94.5 H |
| 4,147,409 | 4/1979 | Apfel | 350/164 |

*Primary Examiner*—James W. Davie
*Attorney, Agent, or Firm*—W. Douglas Carothers, Jr.

[57] ABSTRACT

A multilayered reflector structure deposited on the light emitting surface of a semiconductor electroluminescent device and consecutively comprising a layer of low refractive index material, a layer of intermediate refractive index material and a layer of high refractive index material. Ablative means remove and form an aperture in the outer high index layer at the region of optical radiation emission from said device whereby the level of reflectivity is highest at the center of the aperture as compared to structure regions adjacent to the aperture. In this manner, fundamental mode stabilization may be achieved. Also disclosed is a nonablated three layered reflector structure.

26 Claims, 9 Drawing Figures

APERTURED AND UNAPERTURED REFLECTOR STRUCTURES FOR ELECTROLUMINESCENT DEVICES

BACKGROUND OF THE INVENTION

The present invention relates to apertured and unapertured structures as applied to at least one light emitting surface of semiconductor electroluminescent devices, such as, injection lasers or light emitting diodes (LEDs).

Heretofore, the suggestion has been made to apply multilayered structures to at least one facet surface of an electroluminescent device to provide a high level of reflectivity. If the reflectivity level is high at one of the facet surfaces, the current threshold of the device is reduced because more of the optical radiation is reflected back into optical radiation cavity of the device. Such a multilayered reflector structures are disclosed in U.S. Pat. Nos. 4,092,659 and 4,147,409.

The drawback in the employment of these types of reflectors is that, although reflectivity at one facet surface may be substantially increased, lowering current thresholds, mode stabilization is not achieved but rather undesirably enhanced toward unstabilization.

Furthermore, conventional gain-guided semiconductor injection lasers with known current confinement means exhibit nonlinearities in the light output power verses laser current characteristics. Abrupt changes in these characteristics are referred to as "kinks". Kinks can occur for contact stripe lasers at lower levels of a few milliwatts with contact stripe widths on the order of 8 um or wider.

The presence of kinks is now understood to result from spatial hole burning in the injected carrier profile which, in turn, causes the laser mode to shift laterally along the p-n junction of the injection laser. In the absence of a built-in mode guiding mechanism, such as, for example, curved or angled stripe geometry or a channeled substrate, the lateral mode shift produces a kink in the optical power output.

By providing a spatially selective reflector on at least one facet surface of the device, albeit an injection laser or LED, a higher central reflective region can be created at the point of light emission from the device to thereby increase mode stability and, as a result, increase the power level at which these output kinks occur.

What is proposed here is a multilayered reflector which, by means of an ablative process, will produce a reflector structure that has relatively high modal reflectivity at the center of optical radiation emission from the device, which reflectivity decreases radially from the center of such emission.

The employment of multilayered ablatable structures on at least one facet of such devices is not new in the art. U.S. Pat. No. 3,843,401 discloses an ablatable multilayered structure for determining the location of the p-n junction of a solid state laser device and causing the optical radiation to be emitted from a restricted region at the junction of the device.

SUMMARY OF THE INVENTION

In accordance with the invention, a multilayered reflector structure is deposited on at least one light emitting surface of a semiconductor electroluminescent device, the layers consecutively comprising a layer of low refractice index material, a layer of intermediate refractive index material and an outer layer of high refractive index material. Ablative means, such as an independent and properly aligned laser device or the injection laser itself upon which the multilayered structure is fabricated, is employed to form an aperture in the high index layer at the region of optical radiation emission from the device whereby the level of reflectivity of optical radiation emission is highest at the center of the aperture.

An additional layer of either the low or intermediate index material may be deposited on the high index material layer to prevent any enlargement of the aperture upon subsequent operation of the electroluminescent device.

The high index layer should be an ablative material having high light absorbant capacity for the wavelength of optical radiation.

The low and intermediate index layers of material have thicknesses and refractive indicies such that the additional thickness contributed to the structure by the outer high index layer will render the combined structure less reflective at the optical radiation wavelength. Upon ablation, the reflectivity of the reflector structure will be highest at the point of the aperture in the high index layer compared to adjacent regions of the reflector structure. The optical radiation will have its lowest loss in the region of the aperture whereby fundamental mode stability is achieved.

A further attribute of the present invention is a multilayered reflector of three layers of material consecutively comprising a low index material, a relatively high index material having some light absorbant capacity and a low index material providing a level of reflectivity of about 70 to 85%. Such high levels of reflectivity have not been previously attainable with such multilayered reflectors unless fabricated to include more than three deposited layers of material.

Other objects and attainments together with a fuller understanding of the invention will become apparent and appreciated by referring to the following description and claims taken in conjunction with the accompanying drawings.

DETAILED DESCRIPTION OF THE INVENTION

Ablative Reflector Structures

Figure 1A:
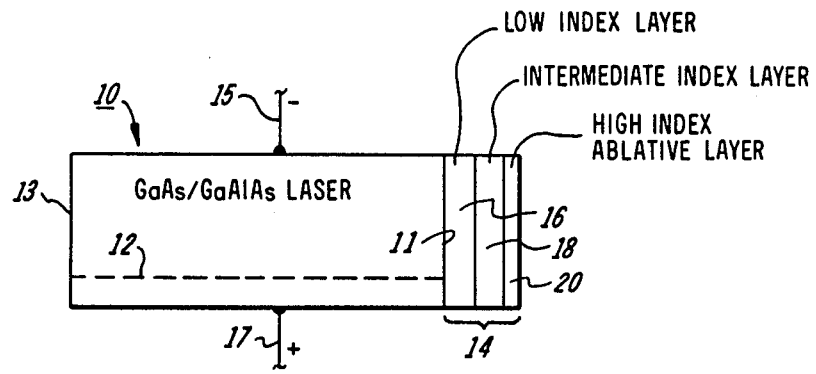
FIG. 1a is a side elevation of a semiconductor injection laser with a multilayered reflector structure of the present invention on one of the facet surfaces of the laser prior to ablation.
Figure 1B:
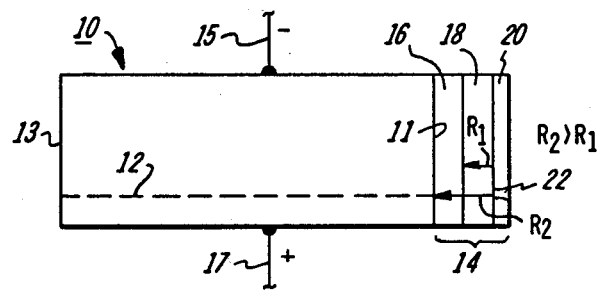
FIG. 1b is the same view as that of FIG. 1a after ablation.
Figure 1C:
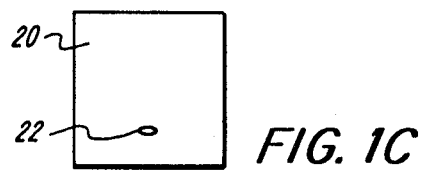
FIG. 1c is an end view of the structure shown in FIG. 1b.
Figure 1D:
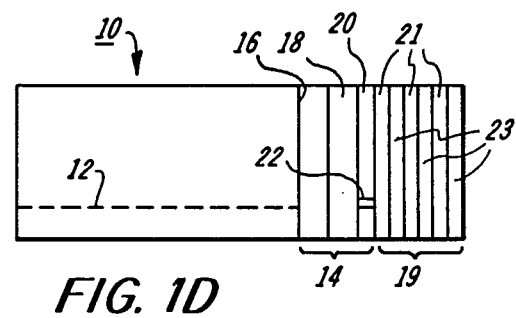
FIG. 1d is the structure shown in FIG. 1b with an additional multilayered reflector applied to the surface of the apertured reflector structure.
Figure 2:
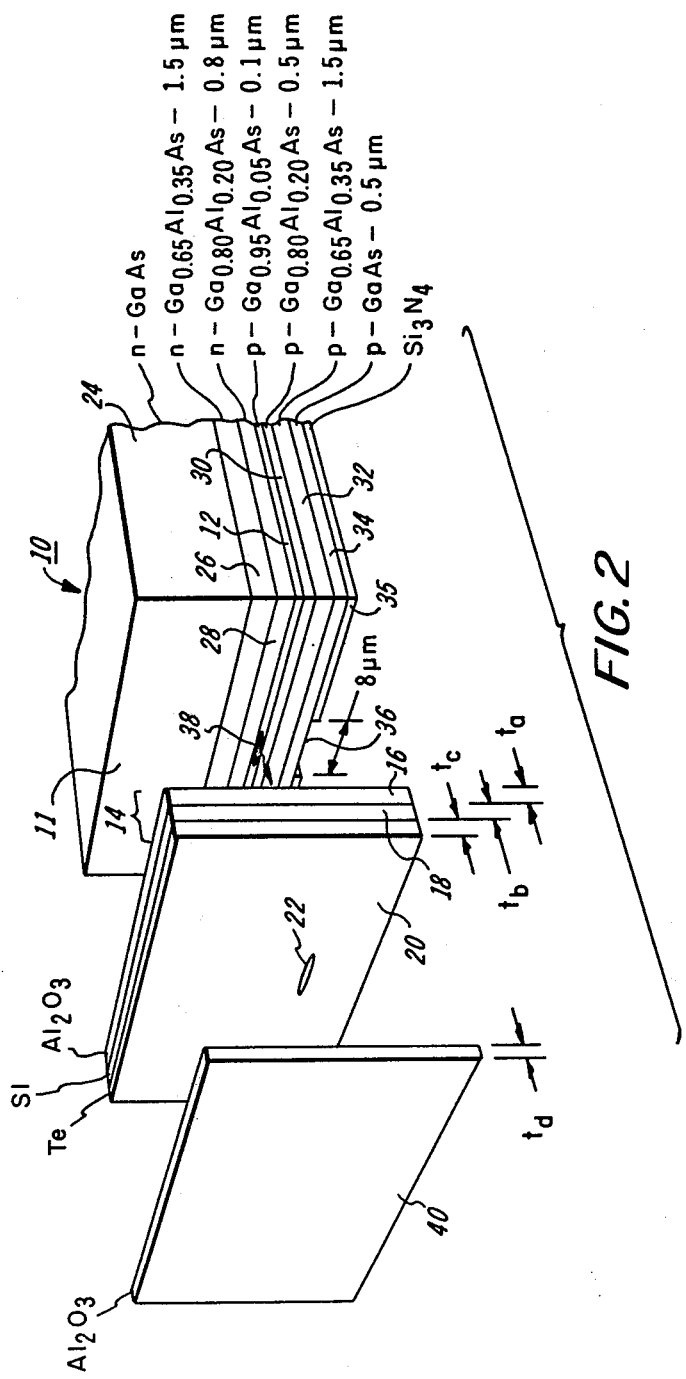
FIG. 2 is a perspective exploded view of a semiconductor injection laser with an apertured multilayered reflector structure of the present invention.

Referring to FIGS. 1 and 2, a semiconductor electroluminescent device in the form of an injection GaAs/GaAlAs laser 10 is shown. Laser 10 is provided with conventional facet surfaces 11 and 13 that function as partial reflectors so that optical radiation may be reflected back into the optical cavity 12 of the laser 10 and propagate therein.

Laser 10 is provided with conventional terminals 15 and 17 to produce a current flow through the laser and establish a bias at its p-n junction to cause population inversion and carrier recombination, as is well known in the art.

A multilayer dielectric structure 14 is deposited on the rear facet surface 11 of the laser 10. The structure consecutively comprises a low refractive index layer 16, an intermediate refractive index layer 18 and an outer high refractive index layer 20. These layers are sequentially deposited by conventional vapor deposition processes.

The material for the low index layer 16 may be selected from the group consisting of $Al_2O_3$, $MgF_2$, $SiO_2$ and $ZrO_2$. The material for the intermediate index layer 18 is selected from the group consisting of silicon and titanium oxide. The high index layer 20 should be a material that has high absorption capacity for optical radiation at the emitted wavelength of the laser used for ablating which may be laser 10 or an external laser to fabricate the reflector aperture. Moreover, the materials must be capable of being ablated and may generally be the same as those used for optical recording media. Such materials include antimony, bismuth, tellurium, selenium, germanium, arsenic, sulfur, and admixtures thereof. Such admixtures may include chemically disordered crystalline or amphorous alloys of selenium, tellurium, arsenic and germanium.

Another material for low index layer 16 is perylene (index of above 1.5), which is chemically dinaphthylene. This material is dielectric, has good optical and heat insulating properties and is impermeable to water or water vapor. Perylene improves the size of the aperture 22 to the full dimensions of the ablating laser beam spot size by acting as a thermal barrier and reducing heat loss from layer 20 during the ablating process. The employment of perylene as layer 16 seals the laser facet 11 from moisture and prevents heat loss into laser 10 during ablation.

Because of the above mentioned properties, perylene is a suitable material for facet encapsulation for injection lasers. The employment of a perylene layer on facets 11 and 13 prevents oxidation and subsequent facet degradation due to oxidation and the presence of water vapor.

The high index layer 20 may have a deposited thickness sufficiently to be effective in providing an overall low reflectivity for the structure 14. On the other hand, the thickness of layer 20 should not be so thick as to not be easily ablated by the optical radiation output of the ablating laser. A sample range of thickness of materials for layer 20 may be 100 A to 400 A.

In the device shown in FIG. 1a, laser 10 itself, is employed to ablate layer 20. Upon application of an applied bias at terminals 15 and 17 in the form of a current pulse or continuous current application, optical radiation is produced in the optical cavity 12. The total thickness of the reflector structure 14 is such that the combined layers have a fairly low level of reflectivity to such radiation. Upon application of a sufficiently large current to laser 10, a high enough power level of emitted radiation, will ablate the high index ablative layer 20 producing the aperture 22 shown in FIGS. 1b, 1c and 2. Such a power level will be several milliwatts.

Using laser 10 as the ablating laser, the ablation of the outer layer 20, such as, tellurium with a thickness greater than 100 A, becomes difficult and not practical. If requirement desired is for a low level of reflectivity in regions adjacent to the aperture 22, the optimized tellurium layer thickness may be in excess of 100 A. To achieve these greater thicknesses, an initial layer 20 of 100 A may be deposited on layer 18 followed by ablation to form aperture 22. To form the aperture, the tellurium at the aperture center point must be brought to its boiling point.

After ablation, a layer of tellurium greater than 100 A may be deposited on the initial tellurium deposited layer, for example, 200 A thick layer. Upon subsequent ablation, the tellurium at the aperture center point need only be brought to its melting point, which requires less optical power than to bring the same material to its boiling point. This is because the initial ablation has formed a torus or non-uniform geometric contour at the aperture 20, which provides a less stable structure for the subsequently deposited tellurium layer. This second deposited tellurium layer will have greater surface tension in the area of the torus and, therefore, will not require as much optical power and heat for reablation at the point of aperture 22.

Upon the second ablation step, the aperture 22 is formed through layer 20 with adjacent nonablated regions of the same layer having the desired thickness.

Figure 5:
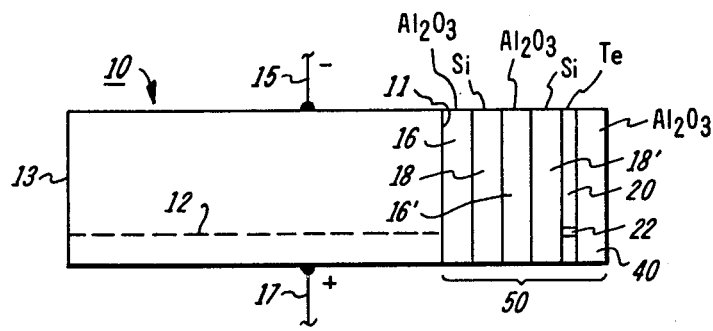
FIG. 5 is a side elevation of a semiconductor injection laser with a modified multilayered reflector structure of the present invention after ablation.

To prevent further ablation and enlargement of aperture 22 upon subsequent use of the laser 10, an outer dielectric layer 40 of low index material, such as $Al_2O_3$, may be deposited on layer 20, as illustrated in FIGS. 2 and 5. The ablation process of layer 20 may be performed prior to the vapor deposition of outer layer 40. With the outer layer 40 used as an encapsulating cover for layer 20, layer 20 will not further ablate unless much higher laser power levels are reached, such as, 5 times the power level required for initial ablation.

When layer 20 is ablated by the emitted radiation from the laser 10 forming the aperture 22, the combined thickness of the structure 44 is reduced to the thickness of layers 16 and 18. If this combined thickness is such that the emitted radiation of highest intensity at the aperture 22 is substantially reflected back into the optical cavity 12 of the laser 10, the laser will operate with its lowest loss in the region of aperture 22 and its operation will be stabilized in the fundamental mode.

The optical power threshold for kinks in the optical power verses current characteristics of the laser 10 will be increased by the self-apertured mirror structure 14 thereby permitting the laser to operate at higher output powers. With the application of the outer layer 40, previously mentioned, a further increase in the optical power threshold for kinks may be achieved resulting in high optical power kink free behavior.

The laser 10 may be operated at lower power levels during the deposition of layer 20, allowing the aperture 22 to be formed during the deposition process. The simultaneous deposition and ablation of layer 20 can be immediately followed with the deposition of the outer dielectric layer 40.

The apertured reflector structure 14 may be advantageously formed on either or both of the rear facet surface 11 or the front facet surface 13 of the laser 10. When so formed on the rear mirror or facet surface 11, it is advantageous to form a highly reflective dielectric stack 19 on the apertured structure 14 as illustrated in FIG. 1d. This structure will reduce required laser current threshold. The stack 19 comprises alternate layers 21 and 23, of low and higher index materials. An example is $Al_2O_3$ and Si quarter wavelength layers 21 and 23 vapor deposited on the surface of high index layer 20.

The reflectivity level of the apertured reflector structure 14 may be improved by adding additional layers to the multilayer dielectric stack structure as shown in FIG. 5. The deposited multilayer structure 50 consecutively comprises a low index layer 16 ($Al_2O_3$), an intermediate index layer 18 (Si), a second low index layer 16' ($Al_2O_3$), a second intermediate index layer 18' (Si), a high index layer 20 (Te) ablated to form aperture 22 and overlayer 40 ($Al_2O_3$). Here, the calculated level of reflectivity at aperture 22 is about 82%.

Thus, the apertured reflector structure 14 provides the highest region of reflectivity at the point of aperture 22 while surrounding regions have lower levels of reflectivity. The reflector structure 14 may be optimized for highest reflectivity at the point of the aperture 22. As one specific example, the combined reflector structure 14 at the point of aperture may have a deposited thickness for layers 16 and 18 at each one quarter wavelength providing a high level reflectivity, $R_2$, whereas regions adjacent to the point of aperture 22 may be greater or less than one half wavelength so that the level of reflectivity $R_1$ is less than $R_2$. The level of reflectivity at aperture 22 may be optimized from 70% to 85% reflectivity while adjacent regions optimized to almost zero level of reflectivity.

The advantages achieved by the employment of the ablative reflector structure 14 are to (1) provide transverse mode stabilization, (2) provide reduction in the spontaneous emission from the laser 10 so that the stimulated emission is many times greater than the spontaneous background radiation, (3) provide spatial filtering of the emitted laser beam from aperture 22 eliminating nonuniformities and interference fringes in the emitted beam and allowing the emitted beam to be readily focused, (4) to isolate the laser 10 from optical reflections outside the laser cavity 12 thereby inhibiting spontaneous laser pulsations that may be caused by such reflections and (5) aid in stabilizing the single longitudinal mode of the laser 10.

As previously indicated, aperture 22 need not necessarily be formed by the laser 10. For example, the aperture may be ablated by means of an external laser of any type (for example, a gas laser), employing the p-n GaAs junction of the laser 10 as an alignment detector. Also the alignment technique for positioning an external laser or an optically coupled optical fiber, as disclosed in U.S. Pat. No. 4,001,719, may be employed to align an external laser in preparation for ablating the layer 20. In such a situation, laser 10 can be used as a detector, as suggested by this patent. The structure 14, being substantially antireflective, will permit easy adjustment of the micropositioner to align laser 10 with the emitted laser beam from such an external laser or a laser coupled optical fiber.

There are several advantages in employing an external laser for ablating layer 20. The external laser may have higher power levels so that relatively thick materials forming layer 20 may be ablated. Also, the geometric shape of the aperture 22 can be controlled. For example, the aperture 22 may be circular or elongated. Further, multiple apertures may be formed in layer 20 and within the internal mode pattern of the optical radiation from laser 10 providing a multiple optical output device. For example, an injection laser having 8 um wide contact stripe provides a half power mode pattern width of about 6 um. Three apertures 22 of 1 um width may be provided in layer 20, separated from one another by 1 um. Such a multi-emitting laser has utility in optical tracking, such as, in optical disc recording and playback.

The multilayer structure 14 may also be applied to the optical radiation emitting surface of conventional light emitting diodes (LEDs). Upon sequential vapor deposition of this structure, an external laser can be properly aligned to the emitting surface of the LED as just explained above to ablate and form an aperture in the high index layer 20. The structure 14 may also be vapor deposited on the surface of the layer of the LED that is contiguous with the LED substrate. Prior to such deposition, the substrate region adjacent to the light emitting region of the LED may be etched away to expose this contiguous layer, after which vapor deposition of layers 16, 18 and 20 is performed. Then, an external laser, properly aligned relative to the light emitting region of the LED may be employed to form a fairly large aperture in the layer 20 to produce a high reflective mirror in the LED substrate increasing the light intensity from the light emitting surface of the LED.

Fabrication

A specific illustration and actual example of the laser 10 and multilayered structure 14 is shown in FIG. 2. The large optical cavity (LOC) laser 10 comprises a substrate 24 of n type GaAs; a layer 26 of n type $Ga_{0.65}Al_{0.35}As$, an optical confinement layer 28 of n type $Ga_{0.80}Al_{0.20}As$, an optical confinement layer 30 of p type $Ga_{0.80}Al_{0.20}As$, a layer 32 of p type $Ga_{0.65}Al_{0.35}As$ and a contact layer 34 of p type GaAs. Layer thicknesses are illustrated in FIG. 2.

LOC laser 10 was provided with an 8 um wide contact stripe as defined by the etched silicon nitride layer 35. The length of laser 10 may be typically 175 to 200 um long.

The laser 10 is mounted p-side down on a header (not shown) and positioned in an electron gun vacuum deposition system for fabrication of the multilayered mirror structure 14.

The laser 10 within the deposition system is connected via terminals 15 and 17 to a current pulse generator having, for example, a 500 nsec pulse width, so that lasing can be achieved while the laser is in the vacuum chamber during the deposition process of structure 14. Optical output from the front facet surface 13 may be monitored by a calibrated photodiode.

As shown in FIG. 2, the fabricated dielectric stack consists of $Al_2O_3$/Si/Te/$Al_2O_3$ which are consecutively vapor deposited layers 16, 18, 20 and 40.

The actual deposition process proceeds as follows. First, an $Al_2O_3$ film 16 with a thickness, $t_a$, of approximately 1200 A is deposited. This is followed by deposition of a Si film 18 of thickness, $t_b$, of approximately 600 A. With estimated refractive indices at approximately 1.7 and 3.5, respectively, these layer thicknesses approximately correspond to quarter wave films at 8500 A. Next, a 100 A Te film 20 is deposited and after that the LOC laser 10 is pulsed to ablate the Te film without removal of the laser from the vacuum chamber. This ablation process can be monitored quite easily by observing the light output power from the front facet 13 of the laser with increasing pulsed pumping current. At the instant Te ablation occurs the laser current threshold suddenly drops and the optical power increases abruptly. The characteristic optical power output verses current curve prior to ablation is not the same after ablation. This behavior demonstrates that the mirror structure reflectivity in the ablated region or aperture 22 increases.

Because ablating is a threshold process, the tellurium is only removed in the region where the laser emitted beam is most intense. By suitably selecting the compositions and thicknesses of layers 16 and 18, the reflectivity of the reflector structure 14 can be high in the ablated region of aperture 22 as compared to adjacent unablated regions. The laser optical radiation favors the center of the higher reflective ablated region. This higher central reflectivity serves to increase lateral mode stability and thereby increases the optical power level at which kinks occur.

Following ablation of the first 100 A thick Te layer, the surface may be overcoated with a second 100 A thick Te film and the above process is repeated. A Te thickness of 200 A in the unablated regions of the layer 20 can be obtained. That thickness is sufficient to reduce the power reflectivity to 15%, whereas if 200 A of Te were deposited initially the laser power needed for ablation would need to be very high.

Finally, an $Al_2O_3$ layer 40 of thickness ($t_d$) approximately 2400 A is deposited. This final half-wave coating prevents the Te layer from ablating further at high optical power levels and has no other effect on the optical properties of the mirror structure 14.

The width of the aperture 22 is approximately 1 um perpendicular to the junction plane at mode center and the length is about 4 to 5 um along the junction plane. The size of the aperture 22 could be increased by raising laser power prior to overcoating the Te layer 20 with the $Al_2O_3$ layer 40. However, if the laser power is increased above the kink level, the ablated region takes on the shape of the laser mode at that current level. As a result, a laser with reflectors ablated at these higher power levels kinked at power levels comparable to such a laser without the mirror structure 14.

Threshold for ablation of the mirror structure 14 is typically about 3-4 mW measured from the front facet surface 13 with a 100 A thick Te layer 20.

Figure 3:
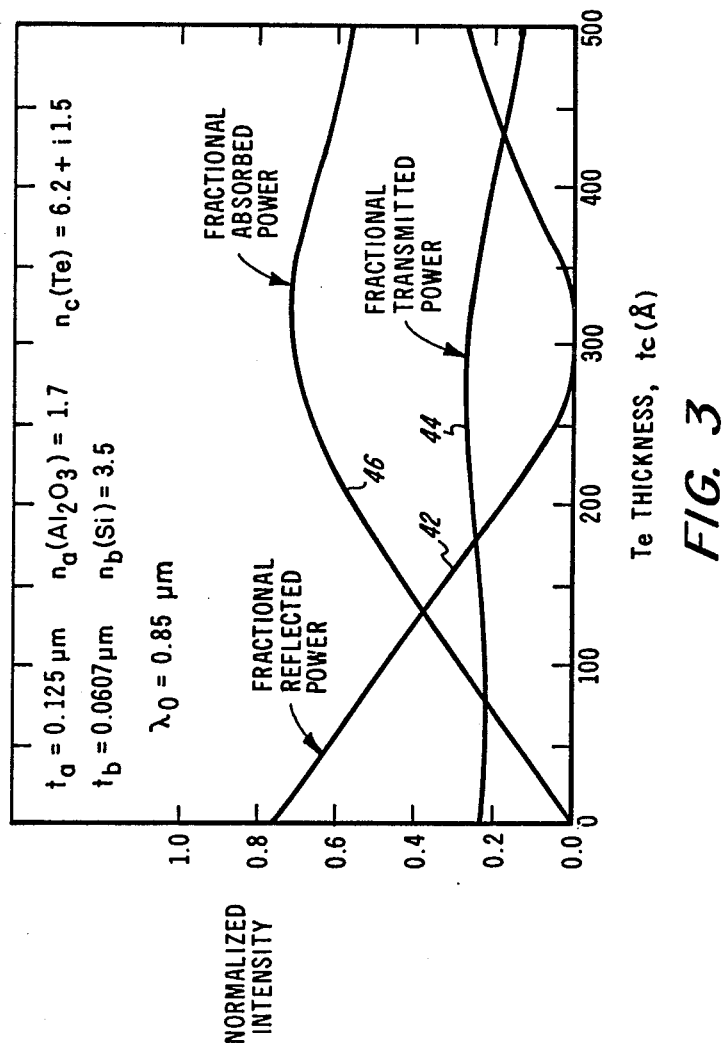
FIG. 3 is a graphic illustration of reflected, transmitted and absorbed optical radiation power as a function of the thickness of the high refractive index layer for the structure shown in FIG. 2.

As a partial theoretical justification of the foregoing, FIG. 3 shows plots of the reflected (curve 42), transmitted (curve 44) and absorbed (curve 46) power of the mirror structure 14, as a function of Te thickness, $t_e$, when applied quarter wavelength layers 16 and 18, respectively, of $Al_2O_3$ and Si. According to mathematical calculations, if all Te were removed in the aperture 22, the facet power reflectivity there would equal 76% and, if 200 A of Te remained in the adjacent unablated regions, only 18% would be reflected outside the aperture.

In practice there are several other factors that determine the actual modal reflectance. First, it is not clear that all the Te is in fact removed from the aperture. A thin uniform layer would not significantly influence behavior adversely as is clear from FIG. 3, but minute particles of Te remaining on the surface of layer 18 in aperture 22 would have a greater effect because of scattering losses. Secondly, the material melted in the aperture 22 is generally not evaporated. Rather surface tension of the Te draws it to the edges where it solidifies and may form a small torus. The reflection at the aperture edge may be much less than the 18%, which is the reflectivity value in unablated regions far from the aperture 22. Finally, since Te ablation is a threshold process, the aperture 22 does not coincide with the total modal extent, but only with its central area. Hence, only the fraction of the reflected wave that overlaps the mode will contribute to the modal reflectivity. For these reasons it is theorized that the modal power reflectivity is substantially smaller than 76%. It is clear, however, that reflectivity is improved by providing a clean ablation in forming the aperture 22 and by controlling ablation to obtain desired size and uniformity in the aperture.

Figure 4:
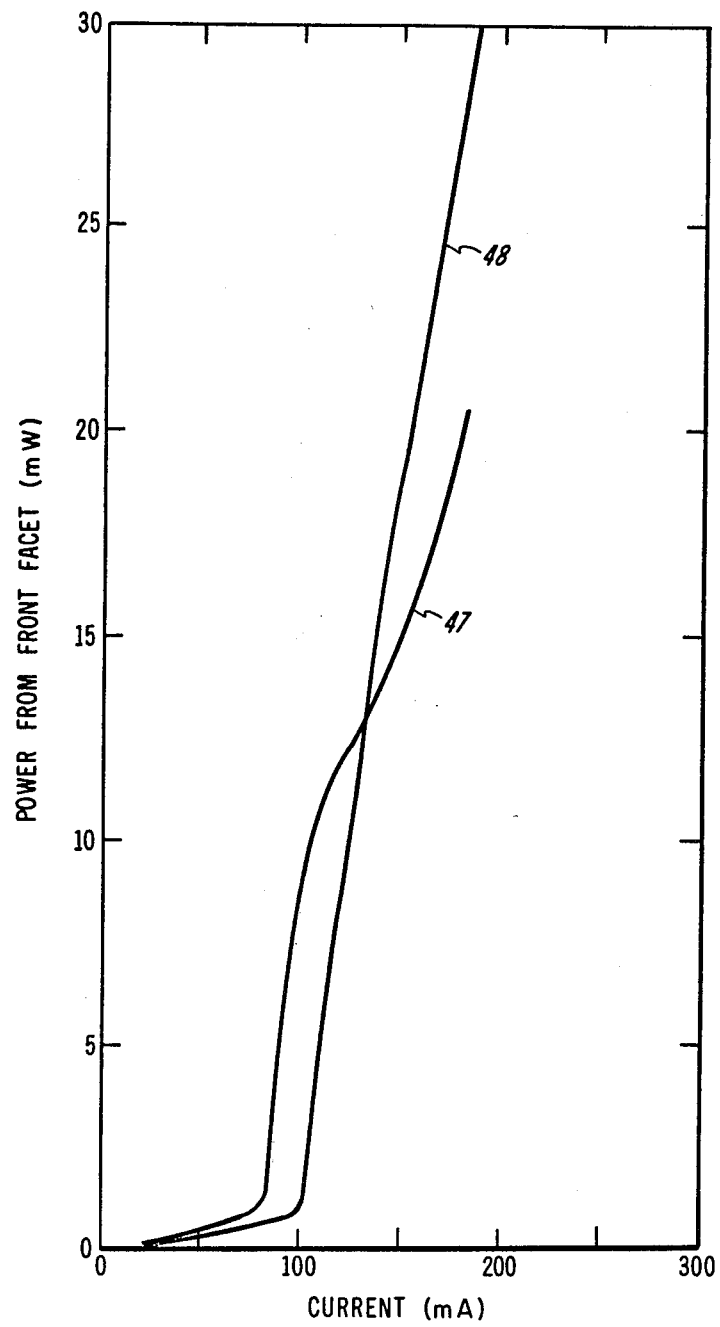
FIG. 4 is a graphic illustration of the optical power output verses applied current for the structure shown in FIG. 2 before and after fabrication of the multilayered mirror structure.

FIG. 4 is a typical optical power output versus current curve for a laser both before and after fabrication of the mirror structure 14. As shown, the laser characteristic for a laser without the mirror structure 14 is shown by curve 47 and is non-linear above about 7 mW and a kink occurs between 10 mW and 15 mW prior to the fabrication of the structure 14. However, after the structure 14 is deposited and ablated, the light output power shown by curve 48 is linear with pumping current even above about 30 mW per facet. In fact, LOC lasers of this type operate linearly up to a pulsed power level of about 40 mW, at which level the Te layer 20 will further ablate thereby enlarging the aperture 22 in spite of the $Al_2O_3$ half-wave layer 40. After this secondary undesired ablation, the kink level decreases to 15 to 25 mW as a result of the larger aperture 22.

It is interesting to note that the threshold for laser operation increases from about 82 mA to about 100 mA for this LOC laser after the apertured mirror structure was fabricated. Other types of lasers tested with this mirror structure have exhibited a threshold increase of from 5% to 30%. This indicates that the overall modal power reflectivity of the apertured mirror structure is somewhat less than 30%, which is its reflectivity with an uncoated facet. The actual reflectivity can be estimated since the laser threshold was initially measured after deposition of the 600 A ($t_a$ about one eighth wavelength) thick $Al_2O_3$ layer 16. At this point in time, the threshold was about 105 mA. Based on calculated mirror reflectivities for $Al_2O_3$ films of about 17% for this thickness, it appears as if the apertured mirror structure 14 has a power reflectivity of about 20%. This reflectivity is much lower than the calculated aperture reflectivity of about 76% for the reasons described above in connection with FIG. 3.

Nonablative Reflector Structures

Figure 6:
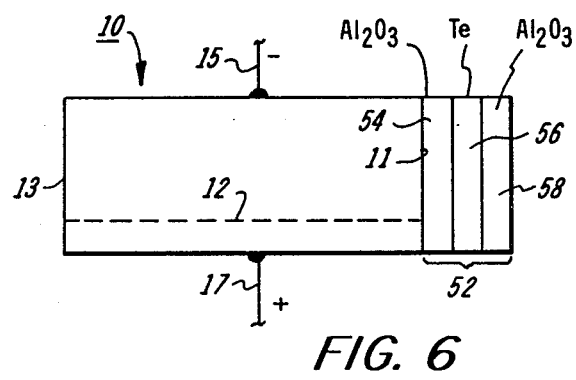
FIG. 6 is a side elevation of a semiconductor injection laser with a nonablated three layered reflector structure.

The vapor deposited structure 52 in FIG. 6 is a nonablative reflector. This three layered structure provides high levels of reflectivity on the order of 70 to 78%. Layer 54 may comprise a quarter wavelength thick layer of $Al_2O_3$, layer 56 a quarter wavelength thick layer of Te and layer 58 may be of variable thickness.

The higher index 56 may be comprised of a material selected from the group of bismuth, tellurium, selenium, antimony, arsenic, germanium and sulfur or admixtures thereof.

Although Te has a high absorbtion capacity for the optical radiation emitted from cavity 12, which is about 15%, the reflectivity of the structure 52 is still high enough where the thickness of layer 58 may be varied from one quarter to one half wavelength with reflected power being respectively about 70% to 78%.

As is recognized by those skilled in this art, laser 10 is not limited to GaAs/GaAlAs lasers. For example, a InP/InGaAsP laser may be substituted for previously described structures of laser 10.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. In a semiconductor laser device including an active layer formed at a p-n junction in the device capable of emitting a substantially coherent light at a predetermined wavelength along said active layer when made opertive by means of a current applied across said junction, the emission of the light from the device being from opposed facet surfaces thereof perpendicular to said active layer, a plurality of contiguous layers on at least one facet surface of said device characterized in that these layers comprise, as consecutively deposited, a low refractive index material, an intermediate refractive index material, and a high refractive index ablative material, the total thickness of said layers being substantially antireflective at said predetermined wavelength, said device, when operated, forms an aperture through said high index material, said low and intermediate materials having a total thickness at said aperture substantially reflective to said light at said predetermined wavelength.

2. In the semiconductor laser device of claim 1 wherein an additional layer of either said low or intermediate index material is deposited on said high index material layer.

3. In the semiconductor laser device of claim 2 wherein said additional layer is deposited on said high index material layer after the formation of said aperture.

4. In the semiconductor laser device of claim 1 wherein at least one additional layer of said high index material is deposited on the initially deposited layer of said high index material after formation of said aperture, said device again operated to form said aperture.

5. In the semiconductor laser device of claim 1 wherein multiple alternating layers of said low and intermediate layers are deposited on said one facet surface prior to the deposition of said high index material layer.

6. In the semiconductor laser device of claim 1 wherein a plurality of contiguous outer layers are sequentially deposited on said high index material layer and comprise alternate layers of high and low refractive index material forming a reflector having a high level of reflectivity.

7. In the semiconductor laser device of claim 6 wherein said contiguous outer layers comprise a material alternately selected from the group consisting of $Al_2O_3$, $MgF_2$, $SiO_2$ and $ZrO_2$ and from the group consisting of Si and $TiO_2$.

8. In the semiconductor laser device of claim 1 wherein in said first formed low and intermediate index material layers have a combined thickness of about one half of said predetermined wavelength.

9. In the semiconductor laser device of claim 1 wherein said high index material layer comprises tellurium.

10. In the semiconductor laser device of claim 8 wherein the thickness of said tellurium layer is approximately 100 A to 400 A.

11. In the semiconductor laser device of claim 1 wherein the material for said low index layer(s) comprises $Al_2O_3$ and the material for said intermediate index layer(s) comprises silicon and the material for said high index layer comprises tellurium.

12. In the semiconductor laser device of claim 1 wherein the material for said low index layer(s) is selected from the group consisting of $Al_2O_3$, $MgF_2$, $SiO_2$ and $ZrO_2$, and the material for said intermediate index layer(s) comprises silicon and the material for said high index layer is selected from a group consisting of antimony, bismuth, tellurium, selenium, germanium, arsenic, sulfur or admixtures thereof.

13. A multilayered reflector structure deposited on at least one facet surface perpendicular to the active layer of a semiconductor laser consecutively comprising a layer of low refractive index material, a layer of intermediate refractive index material and an ablative layer of high refractive index material, said laser operative to form an aperture in said ablative layer at the region of optical radiation emission from said structure, the thickness of said layers being such that when the material from said high index layer is removed to form said aperture, the level of reflectivity of said structure is the highest in said region of said aperture.

14. The multilayered reflector structure of claim 13 wherein an additional layer of either said low or intermediate index material is deposited on said high index material layer to prevent enlargement of said aperture upon subsequent operation of said laser.

15. The multilayered reflector structure of claims 13 or 14 wherein the material for said low index layer(s) is selected from the group consisting of $Al_2O_3$, $MgF_2$, $SiO_2$ and $ZrO_2$, and the material for said intermediate index layer(s) is selected from the group consisting of Si and $TiO_2$ and the material for said high index layer is selected from the group consisting of antimony, bismuth, tellurium, selenium, germanium, arsenic and sulfur or admixtures thereof.

16. A multilayered reflector structure deposited on the light emitting surface of a semiconductor electroluminescent device and consecutively comprising a layer of low refractive index material, a layer of intermediate refractive index material and a layer of high refractive index material, ablative means to remove and form an aperture in said high index layer at the region of optical radiation emission from said device whereby the level of reflectivity for said emission is highest at the center of said aperture.

17. The multilayered reflector structure of claim 16 wherein said device is a semiconductor injection laser.

18. The multilayered reflector structure of claim 17 wherein said ablative means is said semiconductor injection laser.

19. The multilayered reflector structure of claim 17 wherein an additional layer of either said low or intermediate index material is deposited on said high index material layer.

20. The multilayered reflector structure of claim 16 wherein said ablative means is an externally aligned laser source.

21. The multilayered reflector structure of claim 16 wherein said device is a light emitting diode.

22. The multilayered reflector structure of claims 16, 17 or 18 wherein the material for said low index layer(s) is selected from the group consisting of $Al_2O_3$, $MgF_2$, $SiO_2$ and $ZrO_2$, and the material for said intermediate layer(s) is selected from the group consisting of Si and $TiO_2$ and the material for said high index layer is selected from the group consisting of antimony, bismuth, tellurium, selenium, germanium, arsenic and sulfur or admixtures thereof.

23. The multilayered reflector structure of claim 16 wherein the material for said high index layer comprises a crystalline or amphorous alloy of two or more of the materials selected from the group consisting of selenium, tellurium, arsenic and germanium.

24. The multilayered reflector structure of claim 16 wherein the material for said low index layer acts as a thermal barrier.

25. The multilayered reflector structure of claim 24 wherein said low index layer material comprises perylene.

26. The multilayered reflector structure of claim 16 wherein at least one additional high index layer is deposited on the initially deposited high index layer after formation of said aperture, said ablative means to remove and reform said aperture in said additional high index layer.

* * * * *